(12) United States Patent
Brencher et al.

(10) Patent No.: US 6,475,919 B2
(45) Date of Patent: Nov. 5, 2002

(54) METHOD FOR PRODUCING TRENCHES FOR DRAM CELL CONFIGURATIONS

(75) Inventors: Lothar Brencher, Radeberg; Maik Stegememann; Uwe Rudolph, both of Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/753,589

(22) Filed: Jan. 3, 2001

(65) Prior Publication Data

US 2001/0034112 A1 Oct. 25, 2001

(30) Foreign Application Priority Data

Jan. 3, 2000 (DE) .......................... 100 00 003

(51) Int. Cl.$^7$ ............................ H01L 21/302
(52) U.S. Cl. ........................ 438/714; 438/551
(58) Field of Search ................. 257/301, 303, 257/304; 438/551, 243, 318

(56) References Cited

U.S. PATENT DOCUMENTS

| | | | | |
|---|---|---|---|---|
| 3,961,355 A | * | 6/1976 | Abbas et al. | 357/49 |
| 5,259,924 A | * | 11/1993 | Mathews et al. | 156/643 |
| 5,413,966 A | * | 5/1995 | Schoenborn | 437/225 |
| 5,470,782 A | * | 11/1995 | Schwalke et al. | 437/70 |
| 5,550,085 A | * | 8/1996 | Liu | 437/203 |
| 6,228,740 B1 | * | 5/2001 | Niroomand et al. | 438/398 |
| 6,235,643 B1 | * | 5/2001 | Mui et al. | 438/719 |
| 6,372,655 B2 | * | 4/2002 | Khan et al. | 438/714 |

* cited by examiner

Primary Examiner—Hoai Ho
Assistant Examiner—David Vu
(74) Attorney, Agent, or Firm—Laurence A. Greenberg; Werner H. Stemer; Ralph E. Locher

(57) ABSTRACT

The invention relates to a method for producing trenches for manufacturing storage capacitors in DRAM cell configurations. In the method, a two-stage hard mask having a first mask layer (1) and an underlying second mask layer (2) is used. A resist mask is applied to the mask layers (1, 2). The trenches are structured by etching processes, in which, in a first etching process, the first mask layer (1) is etched selectively with respect to the resist mask, and in a second etching process, the second mask layer (2) is etched selectively with respect to the first mask layer (1).

8 Claims, 2 Drawing Sheets

METHOD FOR PRODUCING TRENCHES FOR DRAM CELL CONFIGURATIONS

BACKGROUND OF THE INVENTION

Field of the Invention

The invention relates to a method for producing trenches for manufacturing storage capacitors in DRAM cell configurations.

In known DRAM cell configurations—that is, memory location configurations with dynamic random access—memory locations having one transistor, or what are known as single-transistor memory locations, are usually used. Besides the transistor, which forms a read transistor, this type of single-transistor memory location includes a storage capacitor. An item of information is stored in the storage capacitor in the form of an electrical charge that represents a logical quantity of 0 or 1. By actuating the read transistor via a word line, this information can be read out via a bit line.

Because storage density is increasing from one generation of memory to the next, the required surface area of the memory location must be reduced from generation to generation. Because the reduction of the size of the memory location is limited by the minimum structural size that can be produced in the respective technology, this is also associated with a modification of the structure of the memory locations. Thus, up to the 1 MBit generation of DRAM cell configurations, both the read transistor and the storage capacitor were realized as planar components. Beginning with the 4 MBit memory generation, it has been necessary to configure the storage capacitor and the read transistor three-dimensionally.

Herein, the storage capacitors are not realized planar, but rather in trenches. These types of memory locations are known as deep trench memory locations.

This type of storage capacitor typically consists of two electrodes which are divided by a dielectric and which are disposed adjacent one another in a trench and surrounded by a common insulator layer. The trenches are installed in a semiconductor substrate and terminate at the surface thereof. The semiconductor substrate is usually formed by a silicon wafer. The read transistor includes a gate electrode and a source/drain region. The gate electrode is installed on the top surface of the semiconductor substrate at a defined remove from the storage capacitor; the source/drain region is generated by implanting dopants.

In known DRAM cell configurations, the trenches for the storage capacitors are typically installed in a multistep process including the following steps:

First, a mask layer, which is typically formed by an $SiO_2$ layer, is applied on the wafer that forms the semiconductor substrate. A photosensitive resist mask consisting of a resist layer and an underlying antireflective layer is applied over this mask layer. To generate the resist mask, a hole pattern that corresponds to the structure of the trenches is installed in the resist layer using known photolithography processes.

Recesses are then etched into the mask layer through the holes of the resist mask. A hard mask is created from the mask layer by this etching process, which is known as DTMO etching. This hard mask is in turn used for a second etching process, what is known as DT etching, in which the trenches are etched into the semiconductor substrate through the recesses of the hard mask.

Due to the rapid advancement of technology in the field of DRAM memory locations, equally high capacities are required for deep trench memory locations of this type, given smaller and smaller dimensions. To satisfy this requirement, it is necessary that the trenches of the memory locations have optimally large depths. This in turn necessitates optimally long etch times in the DT etching process. To satisfy this requirement, the layer thickness of the $SiO_2$ layer that forms the hard mask must be optimally large. However, the layer thickness of the hard mask is limited by the construction of the resist mask, particularly its layer thickness. With the contemporary known methods of lithography, resist masks can only be structured up to limited layer thicknesses. For this reason, the layer thicknesses of hard masks that can be used in known DRAM cell configurations are limited to a maximum of approximately 850 nm. The depths of the trenches that can be obtained, and thus the memory location capacities that can be achieved therewith, are undesirably low.

Another problem is that a damaging of the wafer edge in the subsequent etching of the trenches results in the emergence of what is known as black silicon at the edge of the wafer. This is a matter of a local buildup of raw needle-shaped silicon structures in the region of the wafer edge. The wafer is unfit for production in this region due to the high density of defects, so that DRAM cell configurations situated in this region or near it are rejected, thereby undesirably lowering the yield in the manufacturing of DRAM cell configurations.

In response to this problem, the edge of the wafer is typically covered with a collar during the DT etching and/or the DTMO etching. Such a collar is a matter of an etch-resistant ring that is placed over the wafer tightly and that acts as a diaphragm during the execution of the etching processes.

The use of the collar substantially prevents the formation of black silicon. However, the disadvantage of this method is that the collar influences the etching process such that slanted etching profiles instead of vertical profiles are obtained in the environment of the collar in the etching process. This is true particularly of the DTMO etching process for producing the hard mask.

This creates an undesirable shifting of the trenches to the active regions of the DRAM cell configuration, which can ultimately impair the functioning of the overall DRAM cell configuration.

SUMMARY OF THE INVENTION

It is accordingly an object of the invention to provide a method for producing trenches used in forming storage capacitors of DRAM cell configurations which overcomes the above-mentioned disadvantageous of the prior art methods of this general type, and in which the produced memory locations of the DRAM cell configurations have an optimally high capacity with a simultaneously high quality.

With the foregoing and other objects in view there is provided, in accordance with the invention, a method that includes the following steps: First, a first and a second mask layer are applied on a wafer that forms a semiconductor substrate. The first mask layer is considerably thinner than the second, underlying layer. A resist mask is then applied on the first mask layer. This is followed by structuring recesses in the first mask layer in correspondence with the hole pattern of the resist mask by a first etching procedure, whereby the first mask layer can be etched selectively with respect to the resist mask. Lastly, recesses are structured in the second mask layer through the recesses of the first mask layer by a second etching process, whereby the second mask layer can be etched selectively with respect to the first mask layer.

The basic idea of the present invention thus consists in providing a two-stage hard mask for producing the trenches.

Herein, the thickness of the first mask layer, which forms the upper level of the hard mask, is considerably thinner than the second mask layer, which forms the lower level of the hard mask. This structure is inventively achieved in that a material that can be etched selectively with respect to the resist mask is selected for the first mask layer, and a material that can be etched selectively with respect to the first mask layer is used for the second mask layer. The first mask layer preferably consists of polysilicon or crystalline silicon, whereas the second mask layer consists of an oxide, preferably $SiO_2$.

When it is constructed this way, the first mask layer can be easily structured using the resist mask, and the relatively small layer thickness of the resist mask suffices for the structuring. The layer thickness of the first mask layer is preferably less than 250 nm and can be reduced to a layer thickness of approximately 100 nm. The layer thickness of the second mask can reach values of 850 nm and above because of the selectivity of the second etching process. Advantageously, the layer thickness can equal approximately 1 μm or can assume even greater values. In this way, very deep trenches can be created in the production of the memory cells, thereby making it possible to obtain memory cell capacities of approximately 40 fF.

In accordance with an added feature of the invention, when the two-stage hard mask is used to produce trenches for the memory locations of the DRAM cell configuration, it is possible to avoid the emergence of black silicon in the edge region of the wafer without causing an appreciable shifting of the etch profiles in this margin region in the DTMO and/or DT etching processes.

To prevent the emergence of black silicon at the edge of the wafer, it is sufficient to cover the edge of the wafer, preferably with a collar, only during the structuring of recesses in the first, top mask layer. It is advantageous here that the thickness of the first mask layer is significantly less than the thickness of the underlying second mask layer.

In structuring the recesses in the first mask layer, which preferably occurs by a plasma etching process, only a slight shift, if any, is obtained in the region of the collar, and this is because of the small thickness of the first mask layer.

In accordance with an additional feature of the invention, a high-density plasma source is used for the etching process, thereby reducing the influence of the collar on the etching process even further.

In a subsequent step, the second mask layer is structured, also using a plasma etching process, in which etching is performed in the second mask layer through the recesses in the first mask layer.

In this second etching process, the collar is no longer used, since the first mask layer is obtained whole even in the region of the wafer margin. By virtue of the selectivity of the etching of the second mask layer, the wafer margin thus remains intact during the etching process. Black silicon is therefore prevented from forming in the subsequent trench etching process.

The displacement of the trenches is thus determined solely by the thickness of the first mask layer. Since, in the inventive two-level hard mask, the thickness of this first mask layer can be selected to be very small, and namely substantially smaller than the thickness of the second mask layer, the displacement of the trenches is accordingly so small that it does not cause any impairment of the functioning of the DRAM cell configuration.

Other features which are considered as characteristic for the invention are set forth in the appended claims.

Although the invention is illustrated and described herein as embodied in a method for producing trenches for dram cell configurations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
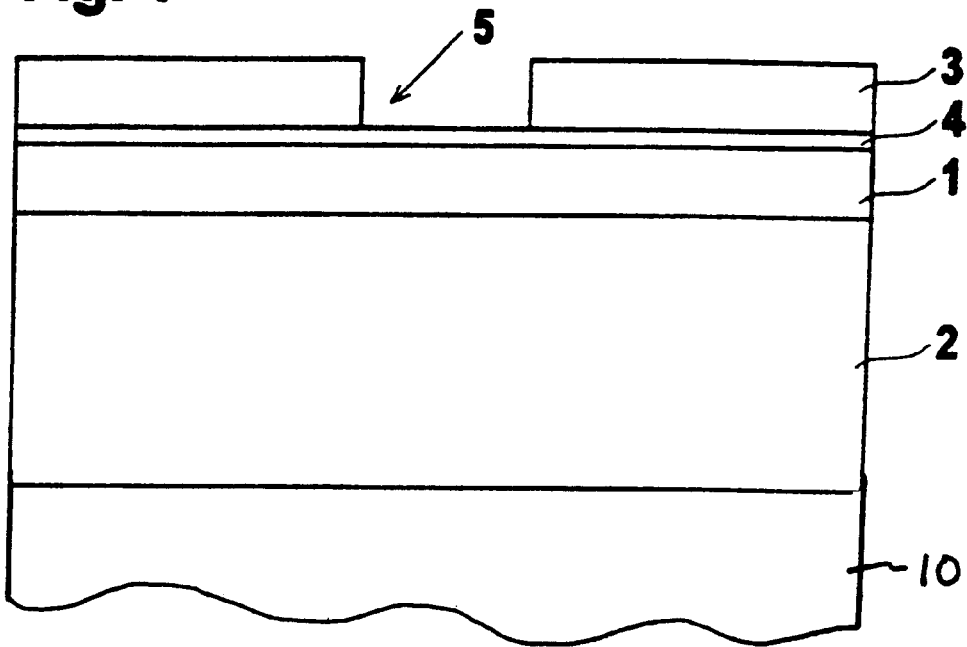
FIGS. 1–4 show schematic representations of a sequence of steps of an exemplary embodiment of the inventive method.

FIGS. 1–4 show schematic representations of the sequence of an exemplary embodiment of the inventive method for producing trenches for the production of storage capacitors in DRAM cell configurations.

This type of DRAM cell configuration includes a plurality of memory locations, which are preferably disposed in a matrix. The DRAM cell configuration typically consists of memory locations which are fashioned as single-transistor memory locations. Each memory location includes a storage capacitor and a read transistor. The read transistor includes a gate electrode and a source/drain region.

In the storage capacitor, an item of information is stored in the form of an electrical charge representing a logical quantity of 0 or 1. By actuating the read transistor via a word line, this information can be read out via a bit line.

The memory locations are fashioned as deep trench memory locations in which the storage capacitors are realized in trenches.

By the inventive method, these trenches are installed in a semiconductor substrate which consists of a silicon wafer.

A two-stage hard mask including first and second mask layers 1, 2 is inventively used to structure the trenches in the semiconductor substrate 10. In a first step, these mask layers 1, 2 are applied on the semiconductor substrate 10. In principle, the hard mask can be applied directly onto the semiconductor substrate 10. Normally, additional layers are configured between the semiconductor substrate 10 and the hard mask, such as a SiN layer, for instance. These layers are of no significance to the inventive method, however.

In the present exemplifying embodiment, this first mask layer 1 is formed by a polysilicon layer. Alternatively, the first mask layer 1 can also be formed from crystalline silicon. In principle, the first mask layer 1 can also be formed from metals or the like. The second, underlying mask layer 2 is formed by an $SiO_2$ layer. In principle, other oxides can also be used for forming the second mask layer 2.

A resist mask including a resist layer 3 and an underlying antireflective layer 4 is applied over the first mask layer 1. The resist layer 3 has a thickness that typically lies in the range from 500 to 600 nm. In the present exemplifying embodiment, the thickness of the resist layer 3 is approximately 570 nm.

The thickness of the antireflective layer 4 depends on the respective type of resist that is used. In the present exemplifying embodiment, this layer thickness equals approximately 56 nm. An organic antireflective layer 4 is preferably used. In principle it is also imaginable to use an amorphous silicon layer.

The thickness of the resist layer 3 is adapted to the thickness of the first mask layer 1.

In the present exemplifying embodiment, the thickness of this first mask layer 1 equals 250 nm. However, in principle, it is possible to use layer thicknesses of approximately 100 nm and even less than 100 nm.

Because the thickness of the first mask layer 1 is very small, and because the use of polysilicon or crystalline silicon makes it possible to etch this first mask layer selectively with respect to the resist mask in order to structure the hard mask by etching processes, the layer thickness of the resist mask can be selected correspondingly small. The particular reason why this is advantageous is that in contemporary lithography methods, the layer thicknesses of the resist masks must be limited to relatively low values.

The layer thickness of the second mask layer 2 is substantially larger than the thickness of the first mask layer 1. The thickness of the second mask layer 2 preferably lies at values of about 900 nm or greater. Preferably, the thickness of the second mask layer 2 equals at least 1 μm. In the present exemplifying embodiment, the thickness of the second mask layer 2 assumes a value of approximately 1 μm. Such large layer thicknesses can be realized because it is possible to use etching processes in the structuring of the second mask layer 2 in which the second mask layer 2 can be etched selectively with respect to the first mask layer 1.

Because of the large thickness of the second mask layer 2, correspondingly deep trenches can be created in the semiconductor substrate for producing the memory locations. In this way, the required capacities for the memory locations can be achieved, which are typically on the order of 40 fF.

With the aid of FIGS. 1–4, an exemplifying embodiment of the inventive method for producing trenches for a DRAM cell configuration will now be described.

By known photolithography processes, a hole pattern is created in the resist layer 3 in correspondence to the configuration of the trenches that must be generated. One such hole 5 in the resist layer 3 of the thus generated resist mask is represented in FIG. 1.

Figure 2:
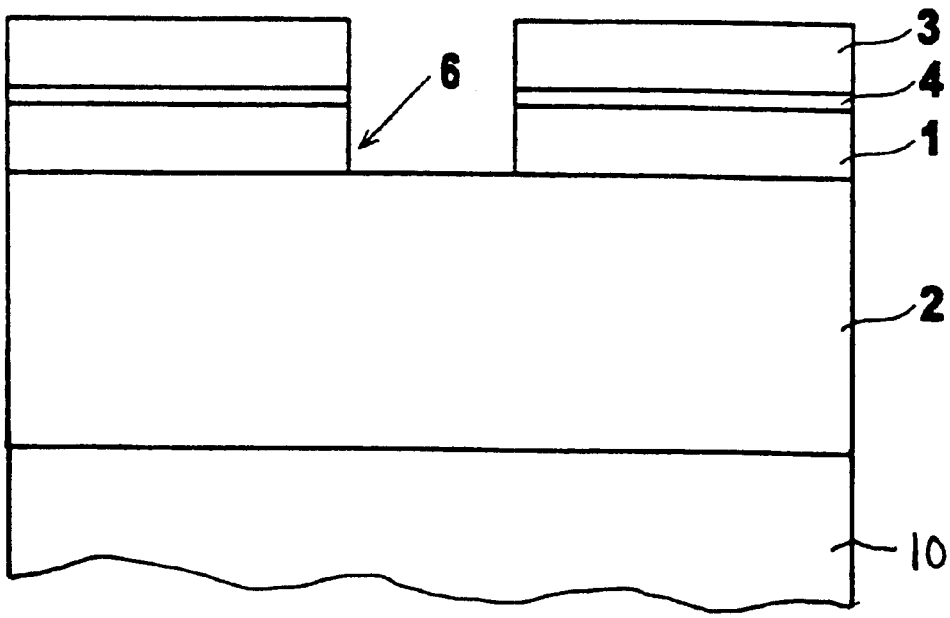

Recesses 6 are inventively structured in the first mask layer 1 through the holes 5 in the resist mask. This is schematically represented in FIG. 2. The structuring of these recesses 6 is accomplished by a plasma etching process.

Advantageously, the edge of the wafer is covered by a collar during this etching process. The collar is formed by an etch-resistant ring that can be positioned tightly over the wafer with the resist mask configured thereon. The collar thus acts as a diaphragm during the etching process and protects the surface in the region of the margin of the wafer. In this way, black silicon is prevented from forming in the region of the wafer margin during the trench etching. This is a matter of the local formation of raw, needle-shaped silicon, which cannot be used for producing DRAM cells and which, as reject material, reduces the yield of the manufacturing process.

In the region of the edge of the collar, the etching of the surface of the hard mask is impaired, so that the profiles of the recesses 6 in the first mask layer no longer run vertically, but rather slightly diagonally. However, since the first mask layer 1 in the inventive hard mask has a very small thickness, this effect has only a slight influence on the subsequent production of the trenches in the semiconductor substrate 10.

Advantageously, a high-density plasma source is used for etching the recesses 5 in the first mask layer 1. In this way, the influence of the collar on the etching process can be minimized.

Figure 3:
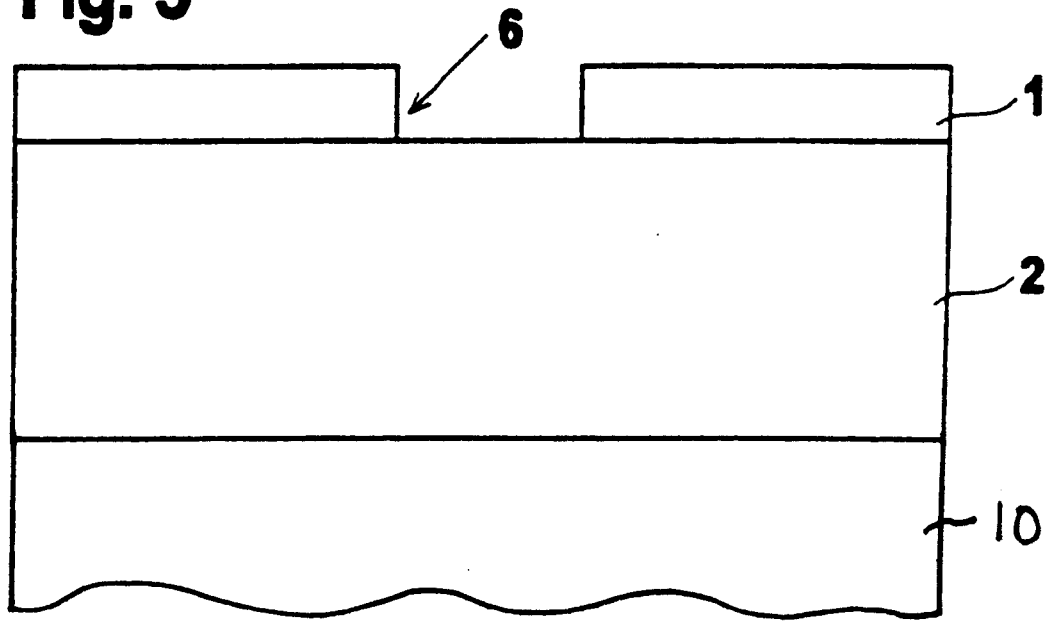
Figure 4:
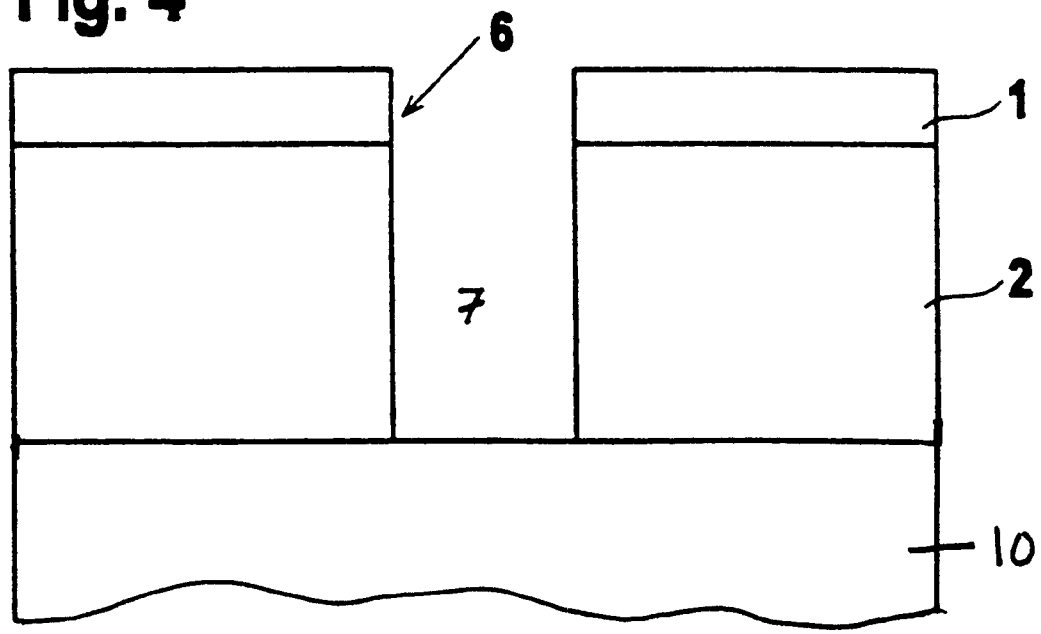

Once this etching process is complete, the resist mask is removed, exposing the first mask layer 1 with the individual recesses 6. This is schematically represented in FIG. 3.

Next, the second mask layer 2 is structured through the recesses 6 in the first mask layer 1 by an additional etching process.

By this second etching process, the recesses 6 in the first layer are etched further, ultimately penetrating the second mask layer 2.

Alternatively, the resist mask can be left on the first mask layer 1. The structuring of the second mask layer 2 is accomplished through recesses 6, which penetrate both the first mask layer 1 and the resist layer. This method has the advantage that the resist mask does not have to be removed for the structuring of the second mask layer 2, and thus a complete step can be omitted.

The second etching process is also formed by a plasma etching process. In principle, a high-density plasma source can also be used here. Alternatively, an RIE (Reactive Ion Etching) process can be used. Preferably, an MERIE (Magnetic Enhanced Reactive Ion Etching) is used.

This second etching process is carried out without a collar. Because the edge of the wafer was covered by a collar during the first etching process for structuring the first mask layer 1, the two-stage hard mask is still complete in this region, thereby preventing the formation of black silicon during the trench etching.

The essential advantage hereof is that the second etching process no longer entails an impairment of the profiles of the recesses 6 by the collar. Specifically, the second etching process does not produce an additional diagonal off-set of the recesses 6.

In the subsequent trench etching process through the recesses 6 of the hard mask, a nearly perfectly aligned positioning of the trenches is obtained. Specifically, the trenches can be relatively positioned with sufficient precision in the active regions of the DRAM cell configuration. The danger of a functional impairment of the DRAM cell configuration by what is known as a DT-AA (Deep Trench Active Area) misalignment is thereby precluded to a high degree of certainty.

It is advantageous therein that the thickness of the first mask layer 1 can be selected to be very small relative to the thickness of the second mask layer 2. This is inventively achieved in that the etching of the second mask layer 2 is accomplished using an optimally high selectivity with respect to the first mask layer 1. By appropriately selecting the materials of the first and second mask layers 1, 2, it is possible to control and minimize the displacement in the trench etching process by sharply reducing the layer thickness of the first mask layer 1.

It is also advantageous that, by constructing the first mask layer 1 separately, it is possible to solve the problem of the displacement of trenches largely independently of the construction of the second mask layer 2.

The second mask layer 2 can then be constructed and adapted according to the technology that is used for the trench etching. In particular, the thickness of the second mask layer 2 can be adapted to the requirements of the trench etching without exacerbating the displacement of trenches.

We claim:

1. A method for producing trenches for manufacturing storage capacitors in DRAM cell configurations, which comprises:

forming a first mask layer having a thickness between 100 nm and 250 nm from a layer selected from the group consisting of a polysilicon layer and a crystalline silicon layer;

forming a second mask layer having a thickness greater than 850 nm from an $SiO_2$ layer;

providing the second mask layer underlying the first mask layer;

placing the first mask layer and the underlying second mask layer on a wafer that forms a semiconductor substrate;

providing a resist mask having a hole pattern and placing the resist mask on the first mask layer;

performing a first etching process to selectively etch the first mask layer with respect to the resist mask and to structure recesses in the first mask layer in correspondence with the hole pattern of the resist mask; and subsequently, performing a second etching process to selectively etch the second mask layer with respect to the first mask layer and to structure recesses in the second mask layer through the recesses of the first mask layer.

2. The method according to claim 1, which comprises covering a wafer margin while the recesses in the first mask layer are structured.

3. The method according to claim 2, which comprises using a collar to cover the wafer margin.

4. The method according to claim 1, which comprises removing the resist mask prior to structuring the recesses in the second mask layer.

5. The method according to claim 1, wherein the first etching process is a plasma etching process and the second etching process is a plasma etching process.

6. The method according to claim 5, which comprises using a high-density plasma source to perform the first etching process.

7. The method according to claim 5, which comprises using a method selected from the group consisting of an RIE method and an MERIE method to perform the second etching process.

8. The method according to claim 1, which comprises providing the resist mask with a resist layer having a thickness from 500 nm to 600 nm and with an underlying antireflective layer having a thickness from 50 nm to 60 nm.

* * * * *